United States Patent [19]
Takayanagi et al.

[11] Patent Number: 5,635,734
[45] Date of Patent: Jun. 3, 1997

[54] INSULATED GATE TYPE SEMICONDUCTOR DEVICE IN WHICH THE RELIABILITY AND CHARACTERISTICS THEREOF ARE NOT DETERIORATED DUE TO PRESSING ACTION AND POWER INVERTER USING THE SAME

[75] Inventors: Yuji Takayanagi; Hideo Kobayashi, both of Hitachi; Shuroku Sakurada, Hitachinaka; Hidekatsu Onose, Hitachi, all of Japan

[73] Assignee: Hitachi, Ltd., Tokyo, Japan

[21] Appl. No.: 402,526

[22] Filed: Mar. 10, 1995

[30] Foreign Application Priority Data

Mar. 16, 1994 [JP] Japan ................................ 6-045368

[51] Int. Cl.$^6$ .................................................. H01L 29/74
[52] U.S. Cl. .......................... 257/152; 257/153; 257/170; 257/178; 257/181; 257/341; 257/144
[58] Field of Search ........................... 257/133, 135, 257/150, 152, 153, 170, 177, 178, 144, 181, 341, 328, 329

[56] References Cited

FOREIGN PATENT DOCUMENTS

| | | | |
|---|---|---|---|
| 63-209173 | 8/1988 | Japan | 257/153 |
| 3-116874 | 5/1991 | Japan | 257/152 |
| 3-218643 | 9/1991 | Japan | 257/177 |
| 4-274330 | 9/1992 | Japan | 257/177 |
| 4-290272 | 10/1992 | Japan | 257/177 |
| 4-322471 | 11/1992 | Japan | 257/177 |

*Primary Examiner*—Minh-Loan Tran
*Attorney, Agent, or Firm*—Antonelli, Terry, Stout & Kraus, LLP

[57] ABSTRACT

An insulated gate type semiconductor device has a gate electrode which controls current flow between two regions of the same conductivity type in a semiconductor substrate. A main electrode has a first portion contacting a first one of the two regions, a second portion extending above the gate electrode and a third portion providing a raised external contact surface to contact an external electrode. The gate electrode is insulated above and below by insulating films. To prevent damage to the gate electrode and the lower insulating films due to the pressure of the external electrode, there is a supporting insulating layer on the surface of the substrate underlying the contact portion of the main electrode and having a thickness substantially greater than the thickness of the insulating film below the gate electrode and the contact surface is more remote from the substrate than the second portion of said main electrode.

30 Claims, 9 Drawing Sheets

INSULATED GATE TYPE SEMICONDUCTOR DEVICE IN WHICH THE RELIABILITY AND CHARACTERISTICS THEREOF ARE NOT DETERIORATED DUE TO PRESSING ACTION AND POWER INVERTER USING THE SAME

BACKGROUND OF THE INVENTION

1. Field of the Invention

The present invention relates to a semiconductor device having an insulated gate structure, and particularly to a press-contact type insulated gate type semiconductor device for handling of electrical power to an assembly of such a device and an external electrode and to a power inverter using such a device.

2. Description of the Prior Art

A semiconductor device of the insulated gate type, for example an insulated gate type bipolar transistor (hereinafter referred to as IGBT), has excellent features in terms of the gate drive system of a voltage type and high speed operation, and therefore has come to be extensively used even in the high voltage/large current field in which the gate turn off thyristor (hereinafter referred to as GTO) has been employed.

Prior art insulated gate type semiconductor devices are usually of a module structure in which a plurality of semiconductor chips of small current capacity are arranged in one package and are connected to external electrodes by wire bonding, soldering or the like. Such a structure has an inconvenience of reduced reliability due to breakage of wire bonding and cracking of solder caused by thermal fatigue. Moreover, with an increase in the number of semiconductor chips incorporated in a module, interconnect inductance and floating capacitance of wire bonding incorporated in the module are increased, and thereby the high frequency operation is made difficult.

To solve these problems, there is proposed a press-contact type structure, as used in a thyristor for electric power or GTO, in which electrode contact regions on one side of a semiconductor substrate are held in pressing contact with an external electrode plate. This eliminates the necessity of wire bonding and soldering, and thereby improves reliability and reduces interconnect inductance and floating capacitance. The press-contact type structure also enables heat release from both the surfaces of the semiconductor device, and thereby it is suitable for a large capacity semiconductor device. This structure, however, has a disadvantage that, when an excessive stress is applied due to irregularities on the surfaces of the contact electrode and the external electrode plate and the thermal contraction of the semiconductor device, a gate insulating film lying under the contact electrode will become deformed or broken, thereby deteriorating the reliability and the electrical characteristics thereof.

JP-A-3-218643 discloses a device structure in which the portions of the source electrode over the gate electrodes are thinner than the other portions thereof, so as to bridge over the gate electrodes. Apart from the difficulty of forming the source electrode of this shape, there is the risk that the thicker portions of the electrode are crushed by the pressing force, so that pressure is applied to the gate electrode.

JP-A-4-290272 and JP-A-4-322471 disclose a device structure in which there are lower portions and higher portions of the surface of the semiconductor substrate, and the gate electrodes are on the lower portions and the cathode electrodes or emitter electrodes are on the higher portions, so that the gate electrodes are not subjected to pressure by the external electrode plate. This device is also complicated to manufacture, and has another disadvantage in that non-uniformity of the sizes of the large number of lower and higher portions formed on the surface of the semiconductor substrate causes deterioration in withstand pressure and non-uniformity of carrying-current in the semiconductor device, thus deteriorating the turn-on or turn-off characteristic.

JP-A-4-274330 discloses a structure in which an aluminium electrode layer is partially removed at portions over the gate electrodes, so that the external electrode plate does not press directly on the gate electrode. However, there is the risk that the relatively soft aluminium is crushed or distorted by the pressure, so that it presses on the gate electrode.

Another problem to be solved in these devices is as follows. As the size of a semiconductor substrate is increased with demand for a large capacity, irrespective of the voltage drive type, the gate signal is retarded at a region remote from the gate terminal contacting the gate lead because of the gate electrode resistance. Consequently, in the semiconductor device, the switching operation is made uneven, so that current is locally concentrated upon switching. This may break the semiconductor device, and fails to give the desired characteristics.

SUMMARY OF THE INVENTION

An object of the present invention is to provide an insulated gate type semiconductor device capable of eliminating the deterioration in reliability and characteristics due to pressing, and a power inverter using the same.

Another object of the present invention is to provide, at least in some embodiments, an insulated gate type semiconductor device capable of obtaining characteristics corresponding to the increased size of a semiconductor substrate, and a power inverter using the same.

In a first aspect, the invention provides an insulated gate type semiconductor device having a gate electrode which controls current flow between two regions of the same conductivity type in a semiconductor substrate. A main electrode has a first portion contacting a first one of said two regions, a second portion extending above the gate electrode and a third portion providing a raised external contact surface. The gate electrode is insulated above and below by insulating films. This device is characterized by a supporting insulating layer on the surface of the substrate underlying the third portion of the main electrode and having a thickness substantially greater than the thickness of said insulating film below said gate electrode. The contact surface of the main electrode is more remote from said substrate than the second portion of said main electrode. In another aspect, the invention consists of an insulated gate type semiconductor device comprising:

(a) a semiconductor substrate having a first main surface and a second main surface;

(b) a first semiconductor region of a first conductivity type, provided in the substrate and exposed at the first main surface;

(c) a second semiconductor region of a second semiconductor type, opposite to the first conductivity type, provided in the first semiconductor region and exposed at the first main surface and including a channel portion;

(d) a third semiconductor region of said first conductivity type, provided in said second semiconductor region and exposed at the first main surface;

(e) a gate electrode having an active portion located above the first main surface and sufficiently close thereto to control flow of current between the first and third semiconductor regions via the channel portion;

(f) a first gate insulating layer on the first main surface and lying between the active portion of the gate electrode and the channel portion;

(g) a second gate insulating layer lying above the active portion of the gate electrode;

(h) a first main electrode on the first main surface of the substrate contacting the third semiconductor region and having at least one raised contact portion providing an external contact surface for contact with an external electrode, the external contact surface not overlapping the active portion of the gate electrode;

(i) a supporting insulating layer on the first main surface lying between the raised contact portion of the first main electrode and the first main surface and having a thickness greater than the thickness of the first gate insulating layer; and (j) a second main electrode on the second main surface of the substrate.

Preferably, the supporting insulating layer has a thickness greater than the total thickness of the active portion of the gate electrode and the first and second gate insulating layers.

The thickness of the supporting insulating layer is, preferably, at least 1 μm, which provides high resistance to the pressing force and reduces risk of crushing of the layer.

The first main electrode, preferably, has a plurality of the raised contact portions each of which is surrounded, as seen in plan view looking onto the first main surface, by the gate electrode, there being a plurality of the supporting insulating layer regions respectively underlying the raised contact portions.

Preferably, the device has a pair of the second semiconductor regions extending parallel to each other along the first main surface, a pair of the third semiconductor regions extending parallel to each other, a pair of the active regions of said gate electrode extending parallel to each other with the channel regions of said second semiconductor regions at the mutually proximal sides thereof, the supporting insulating layer lying laterally between the pair of active portions, the first main electrode extending over the pair of active portions and the supporting insulating layer region.

A large scale device of the invention preferably has a plurality of unit blocks each comprising a plurality of the second and third semiconductor regions, a plurality of the active regions of the gate electrode, a plurality of the first and second gate insulating layer regions, a plurality of the raised contact portions of the first main electrode and a plurality of the supporting insulator layer regions. The device further has interconnect electrodes on the first main surface connecting the respective gate electrodes of the unit blocks to each other.

In yet another aspect, the invention provides an insulated gate type semiconductor device comprising features (a) to (f) above and further having:

(g) a first main electrode on the first main surface of the substrate contacting the third semiconductor region and having at least one raised contact portion providing an external contact surface for contact with an external electrode;

(h) a supporting insulating layer on the first main surface lying between the raised contact portion of the first main electrode and the first main surface of the substrate and having of greater than 1 μm; and (i) a second main electrode on the second main surface;

(j) wherein the surface of the semiconductor device above the active portion of the gate electrode is closer to the first main surface than the external contact surface of the first main electrode.

Yet further, the invention provides an insulated gate type semiconductor device comprising features (a) to (f) above, and further having:

(g) a first main electrode on the first main surface of said substrate contacting the third semiconductor region to provide an interface therewith and having at least one raised contact portion providing an external contact surface for contact with an external electrode;

(h) a supporting insulating layer formed on the first main surface to provide an interface therewith and lying between the raised contact portion of the first main electrode and the first main surface of said substrate; and (i) a second main electrode on the second main surface;

(j) wherein the surface of the semiconductor device above the gate electrode is closer to the first main surface than the external contact surface of the first main electrode, and wherein the interface of the first main electrode with the third semiconductor region is coplanar with the interface of said supporting insulating layer with said first main surface.

Preferably, in an IGBT device, there is a fourth semiconductor region of the second conductivity type provided in the substrate and exposed at the second main surface and contacted by the second main electrode. However, in a MOSFET device, for example, this fourth semiconductor region is omitted.

In the insulated gate type semiconductor device of the present invention, the height of the contact region of the main electrode provided on the supporting insulating layer is higher than the height of the portion above the gate electrode. Accordingly, when an external electrode is pressed onto the device, the gate electrode portion is not directly applied with pressure. Since the insulating member is relatively thick, it has a suitable mechanical strength, and thus does not tend to be deformed or broken when the pressing force is applied. As a result, the gate electrode is well protected from the pressing force. The insulated gate type semiconductor device, therefore, can prevent the deterioration of both the reliability and the characteristics due to the pressing force.

In the insulated gate type semiconductor device in another aspect of the present invention, an interconnect electrode is provided in a groove portion to reduce the risk of contact of the interconnect electrode with an external electrode, so that the thickness of the interconnect electrode can be increased. Moreover, since the interconnect electrode may be provided so as to cover the groove portion, the gate electrode extending into the groove portion is positively contacted with the interconnect electrode while being not cut at the groove portion. Thus, even when the size of the semiconductor substrate is increased, the delay of a control signal to a region separated from a control terminal can be reduced in that the control terminal, is connected with low resistance to the gate electrode. The switching operation in the insulated gate type semiconductor device is thus equalized, thereby obtaining a characteristic corresponding to the size of the semiconductor substrate.

BRIEF DESCRIPTION OF THE DRAWINGS

Embodiments of the invention will now be described by way of non-limitative example, with reference to the accompanying drawings. In the drawings.

DESCRIPTION OF THE PREFERRED EMBODIMENTS

In the figures, the same reference numbers designate the same or corresponding parts.

Figure 1:
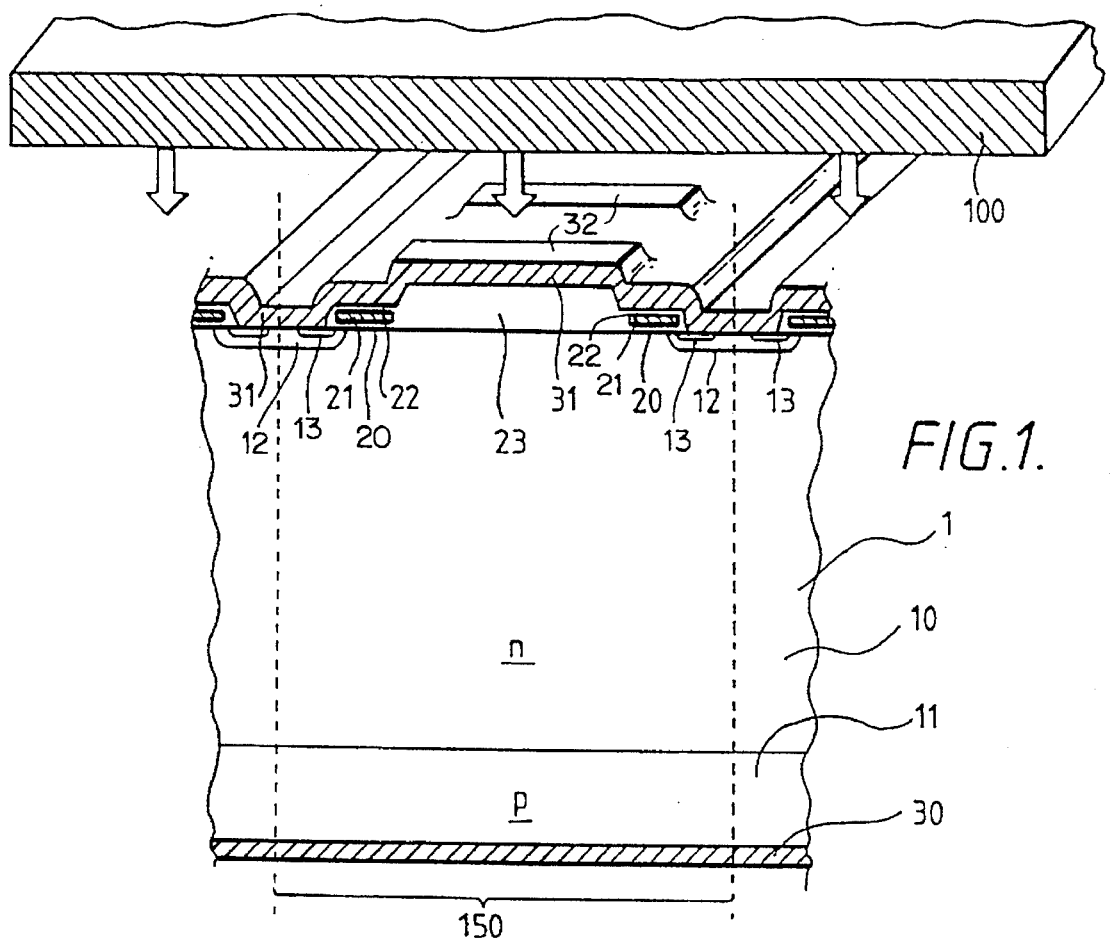
FIG. 1 is a sectional view of the structure of a portion of a semiconductor device which is a first embodiment of the present invention.

FIG. 1 shows a sectional structure of a basic unit cell 150 of an IGBT of the class having a withstand voltage 2000 V. FIGS. 4 to 7 generally illustrate the whole of the structure of the device 300 and its use. An n-type first semiconducting layer 10 (hereinafter, referred to as n-type base layer) is provided in a semiconducting substrate 1 made of silicon. P-type second semiconducting layers 12 (hereinafter, referred to as p-type base layers) are provided within the n-type base layer 10 so as to be exposed at one main surface (upper main surface, in this figure) of the substrate 1. N-type third semiconducting layers 13 (hereinafter, referred to as n-type emitter layers) are provided within the p-type base layers 12 so as to be exposed at the same main surface of the substrate 1. A p-type fourth semiconducting layer 11 (hereinafter, referred to as p-type collector layer) is provided at the other main surface side (lower main surface in this figure) of the substrate 1. Each of the p-type base layers 12 and the n-type emitter layers 13 is formed in a stripe shape extending in the depth direction of the figure. The shape of each of these layers 12 and 13, however, is not limited to a stripe shape. For example, the n-type emitter layer 13 may be divided into a plurality of parts. To obtain the withstand voltage of the class of 2000 V, in the n-type base layer 10, the resistivity is set at about 150 Ωcm, and its thickness is set at about 270 μm.

One main electrode 30 (hereinafter, referred to as collector electrode) made of aluminum is provided on the lower main surface of the semiconducting substrate 1 in contact with the collector layer 11. On the upper main surface side of the semiconducting substrate 1, a control electrode 21 (hereinafter, referred to as gate electrode) is located above the exposed surfaces of the n-type emitter layer 13, p-type base layer 12, and n-type base layer 10 and spaced therefrom by a gate oxide film 20 as a first insulating film. The gate electrode 21 is made of conductive polycrystalline silicon and has its active regions at its locations over the channel regions of the semiconductor device discussed below, where the gate electrode effects control of current flow. A protective oxide film 22 as a second insulating film is provided on the surface of the gate electrode 21. On the exposed surface of the n-type base layer 10 between the adjacent p-type base layers 12, a plurality of elongate and thick oxide support films 23 (hereinafter, referred to as pressing oxide films) are formed so as to extend perpendicularly to the longitudinal direction of the stripe shaped p-type base layer 12. Here, the thickness of the pressing oxide film 23 is larger than the total thicknesses of the gate oxide film 20, the gate electrode 21 and the protective oxide film 22. In this embodiment, the thicknesses of the gate oxide film 20, gate electrode 21 and protective oxide film 22 are 0.1, 0.5 and 1 μm, respectively; and the pressing oxide film 23 is formed to a thickness of 3 μm which is larger than the total of the above thicknesses.

Figure 2:
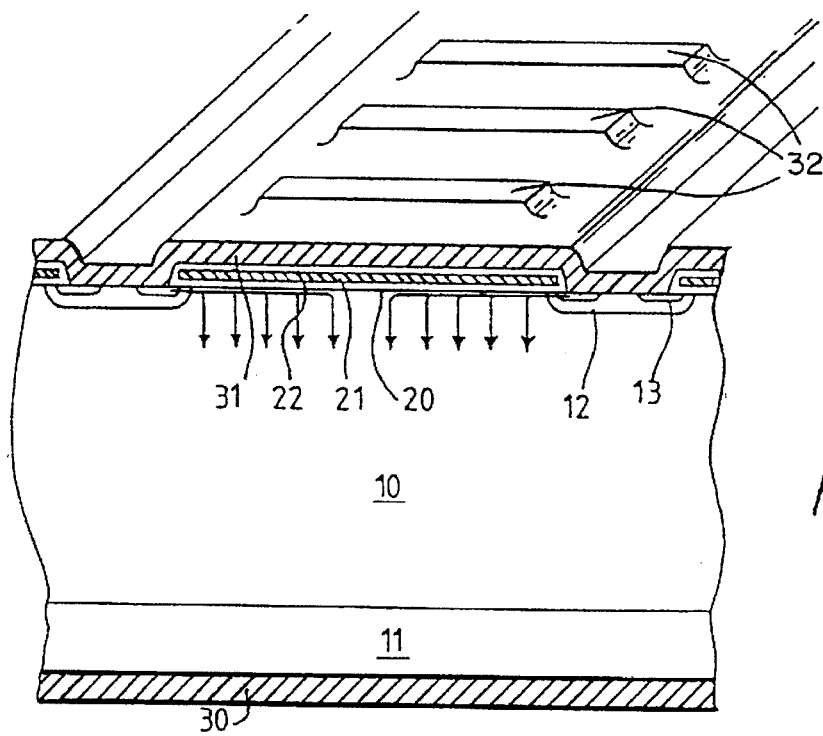
FIG. 2 is a section view of the device of FIG. 1 in a different plane parallel to that of FIG. 1.

The gate oxide film 20, gate electrode 21 and protective oxide film 22 extend across the surface of the substrate 1 between the adjacent pressing oxide films 23, as can be seen in FIG. 2. In addition, at the portion at which each pressing oxide film 23 is provided, the gate electrode 21 does not extend over the exposed surface of the n-type base layer 10.

The other main electrode 31 (hereinafter, referred to as the emitter electrode) made of aluminum is provided on the surfaces of the p-type base layer 12, n-type emitter layer 13, protective oxide film 22, and pressing oxide film 23. This electrode film 31 generally has a uniform thickness. The emitter electrode 31 is in the ohmic contact with the exposed surfaces of the p-type base layer 12 and n-type emitter layer 13. An external electrode plate 100 makes contact with the raised contact portions 32 of the emitter electrode 31 which are located over the pressing oxide films 23 and is pressed against these contact portions 32. The electrode 31 thus has lowest regions contacting the base and emitter layers 12,13, intermediate height regions lying over the active portions of the gate electrode 21 and uppermost portions 32 forming the external contact areas over the pressing oxide films 23.

In the structure of this embodiment, since the thickness of the pressing oxide film 23 is larger than the total thickness of the gate oxide film 20, gate electrode 21 and protective oxide film 22, the height (above the flat substrate surface) of the surface of the portions 32 of the emitter electrode 31 on the pressing oxide film 23 is higher than that of the surface of the portions of the emitter electrode 31 lying over the active portions of the gate electrode 21. Upwardly projecting topmost contact portions of the emitter electrode 31 is thus provided. Accordingly, when the basic unit cell 150 is pressed by the flat external electrode plate 100, the projecting contact portions of the emitter electrode 31 are pressed and contacted with low resistance with the plate 100. The portion of the emitter electrode 31 lying over the gate electrode portion is not contacted with the plate 100, so that the active region of the gate electrode is not directly subjected to the pressing force. This makes it possible to prevent the deformation and the breakage of the gate oxide film 20 and the gate electrode 21 due to the application of the pressing force. The pressing oxide film 23, which is thicker and therefore stronger than the gate oxide film 20, is difficult to deform and break, so that there is no tendency for any influence of the pressing force to be exerted laterally on the gate electrode 21 and the gate oxide film 20. The effect is more increased because the gate electrode 21 does not extend within the pressing oxide film.

Moreover, in this embodiment, at the pressed portions 32 (contact regions) of the emitter electrode 31, there is the double structure of the oxide film (pressing oxide film 23) and the aluminum electrode; accordingly, the lateral extension of aluminum under applied pressure can be suppressed to a low value, as compared with the case where there is only a thick aluminum electrode at this region. Therefore, it becomes possible to prevent the gate electrode portion from being indirectly applied with pressure by the extended aluminum. Thus, according to this embodiment, a press-contact type IGBT with a high reliability can be realized.

Figure 3:
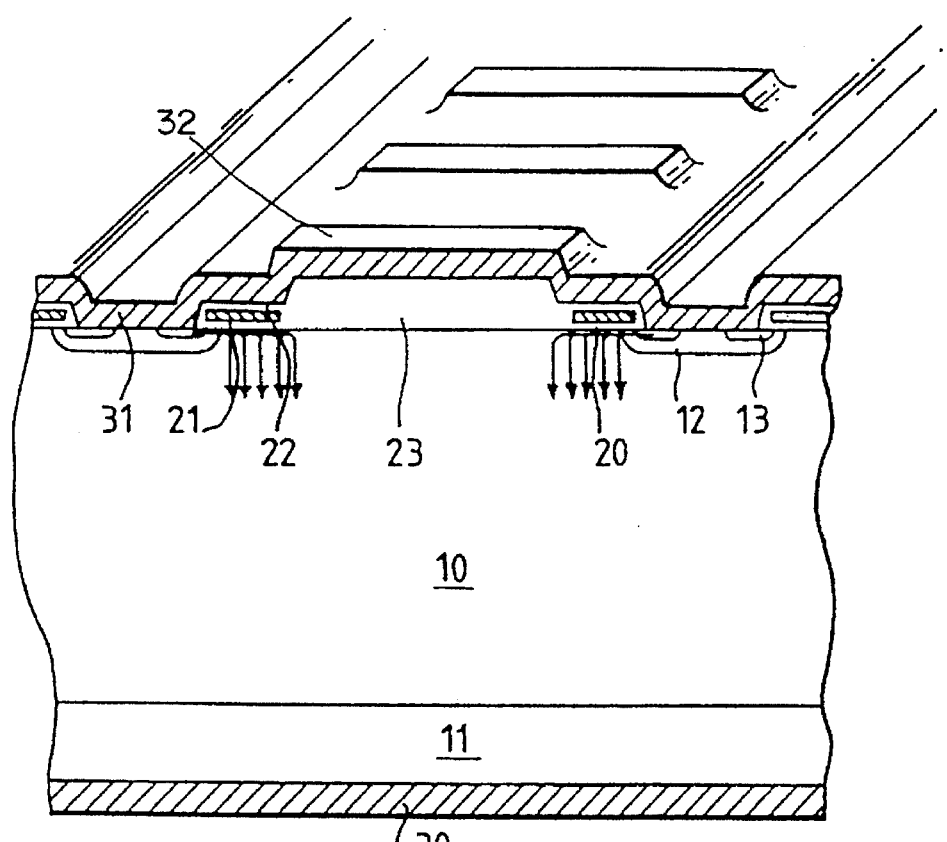
FIG. 3 is a section view of the pressing oxide film in the same plane as that of FIG. 1, showing current flow.

FIG. 2 is a sectional view of the portion between the pressing oxide films 23, and FIG. 3 is a sectional view of the pressing oxide film portion, each of which shows the flow of electrons.

In this embodiment, as FIG. 2 shows a plurality of the pressing oxide films 23 are provided such that the gate oxide film 20, gate electrode 21, and protective oxide film 22 extend between the adjacent pressing oxide films 23. The effect of this structure will be described below.

As shown in FIGS. 2 and 3, in the conductive state, electrons injected from the n-type emitter layer 13 pass through an n-channel formed on the surface of the p-type base layer 12 under the active region of gate electrode, and reach the n-type base layer 10. The electrons injected in the n-type base layer 10 pass through an accumulation layer of electrons formed by biasing the gate electrode 21 provided between the adjacent pressing oxide films 23 to be negative relative to the emitter electrode 31, and thus extend within the n-type base layer 10. Accordingly, the extension of a current in the device in the conductive state is made larger, thus reducing the on-voltage. In this embodiment, a plurality of the pressing oxide films 23, each being formed in an elongate and rectangular shape, are provided at specified intervals such that the sectional structure shown in FIGS. 2 and 3 is repeated. In the structure of this embodiment, by setting the width of the pressing oxide film 23 (the width in the direction perpendicular to the longitudinal direction) to be 10 µm, and the distance from the end portion of the n-type emitter layer 13 to the end portion of the pressing oxide film 23 in the longitudinal direction to be 15 µm, it becomes possible to reduce the on-voltage to a minimum.

Figure 8:
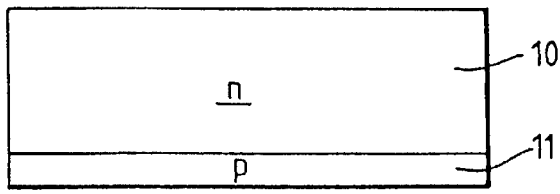
FIGS. 8 to 12 illustrate process steps in a manufacturing method for the first embodiment of the present invention of FIG. 1.
Figure 9:
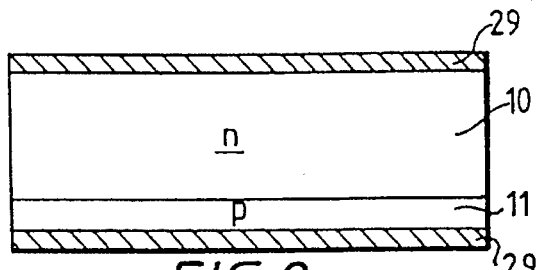
Figure 10:
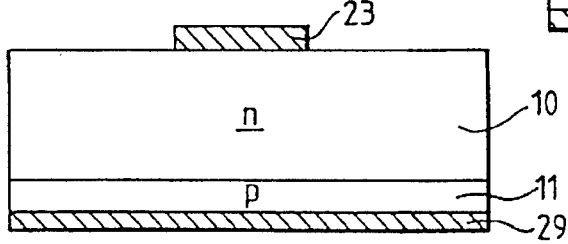
Figure 11:
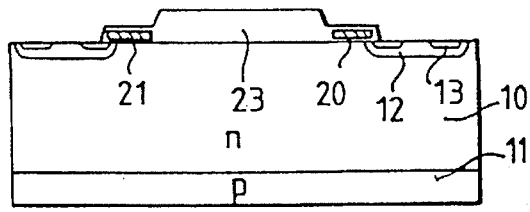
Figure 12:
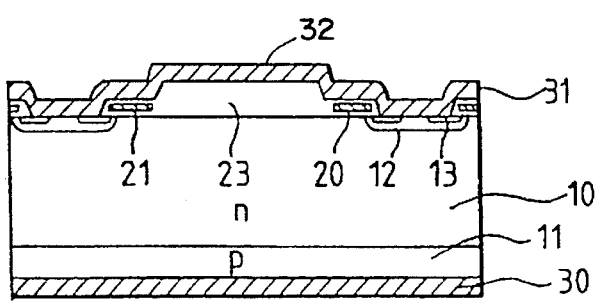

FIGS. 8 to 12 show diagrammatically a method of manufacturing the unit cell of the IGBT of this first embodiment. First, as shown in FIG. 8, on the main surface at the anode side of an n-type silicon substrate having a resistivity of 150 Ωcm, ions of a p-type impurity such as boron are implanted by ion implantation or thermal diffusion, to form the p-type collector layer 11. Next, as shown in FIG. 9, over the other main surface of the silicon substrate, a silicon oxide film 29 having a thickness of 3 µm is formed. The silicon oxide film is selectively etched, as shown in FIG. 10, to form the pressing oxide film 23. Next, as shown in FIG. 11, there are sequentially formed, the gate oxide film 20 (made of silicon oxide), the gate electrode 21 (made of phosphorus-containing polycrystalline silicon), the p-type base layer 12, an n-type emitter layer 13, and the protective oxide film 22 (made of silicon oxide). Next, as shown in FIG. 12, the collector electrode 30 and the emitter electrode 31 are formed of aluminum. Thus, the basic cell shown in FIG. 1 can be manufactured.

As described above, the IGBT to which the present invention is applied can be easily manufactured by conventional methods without use of any special method and material. By use of a hard material, for example silicon oxide, as an insulating pressing film 23, the desired strength against a pressing force can be obtained.

FIGS. 4 to 7 show a large capacity IGBT of a class of withstand voltage 2000 V and of a current capacity 2000 A, in which there are very many of the unit cells shown in FIGS. 1 to 3.

Figure 4:
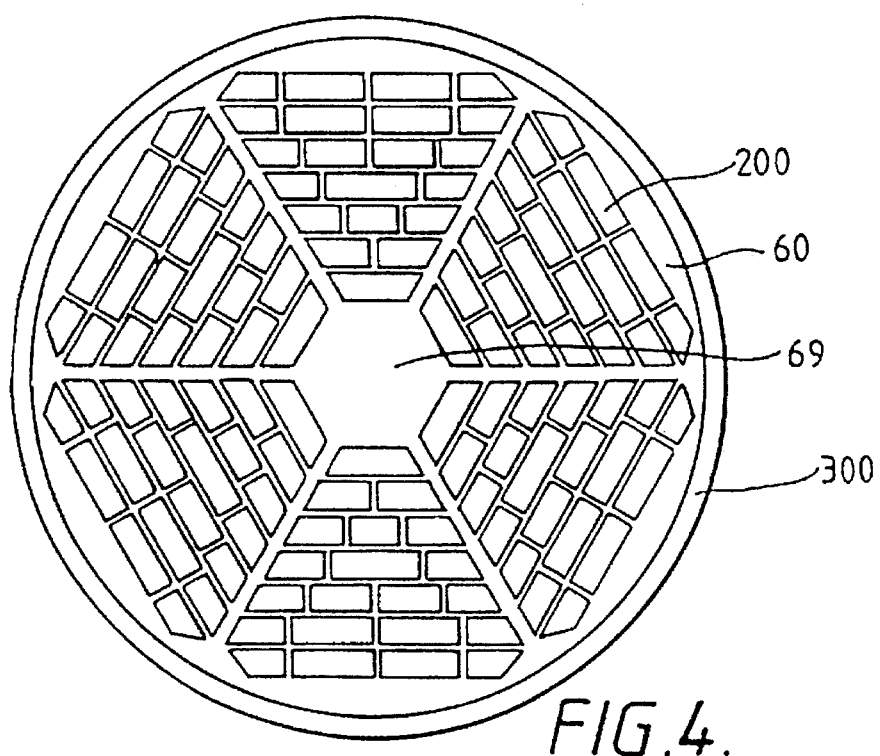
FIG. 4 is a plan view of a whole semiconductor device which is a second embodiment of the present invention.

FIG. 4 shows a view on the face of the large capacity IGBT on the emitter side. A plurality of unit blocks 200, each being operated as IGBT, are disposed on a circular wafer 300 having a diameter of about 60 to 70 mm. A gate lead take-off portion 69 is formed at the central portion of the circular wafer 300, and the unit blocks 30 are radially arranged to surround the gate lead take-off portion 69. A gate interconnect electrode 60 connected to the gate lead take-off portion 69 is formed around each unit block.

Figure 5:
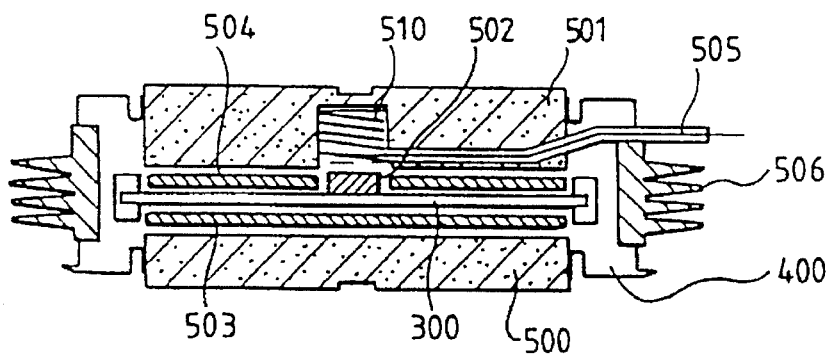
FIG. 5 is a diagrammatic sectional view of an assembly package containing the device of FIG. 4.
Figure 6:
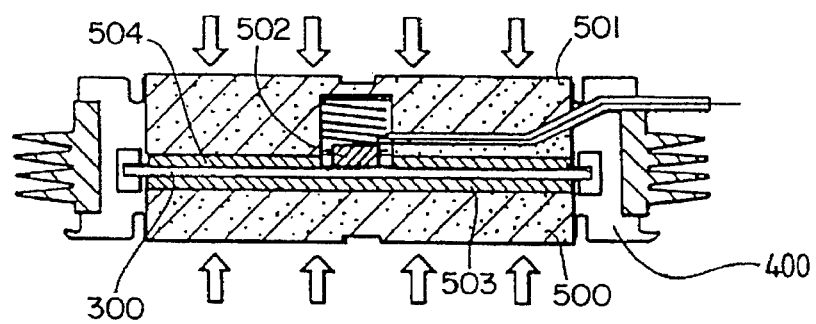
FIG. 6 is a view, corresponding to FIG. 5, showing the electrode press-contact state in the package.

FIG. 5 shows in section an assembly of an insulated gate type semiconductor device 400 including the circular IGBT structure 300 of FIG. 4 contained in a flat type press-contact package. FIG. 6 shows the state where the device 400 is pressed by an external pressing apparatus (not shown) so that the circular IGBT 300 is pressed by post electrodes 500 and 501 on the collector electrode and emitter electrode sides. The external electrode 500 for collector and the external electrode 501 for emitter are respectively disposed on the surfaces of the collector electrode 30 and the emitter electrode 31 of the circular IGBT by way of strain damping plates 503 and 504. A gate post electrode 502 connected to a gate lead 505 is pressed by a spring to contact the gate electrode take-off portion 69. A ceramic insulating member 506 is formed around the package for making larger the distance between the external electrode 500 for collector and the external electrode 501 for emitter. Each of the strain damping plates 503 and 504 is made of molybdenum or tungsten being substantially equal to silicon in linear expansion coefficient.

Figure 7:
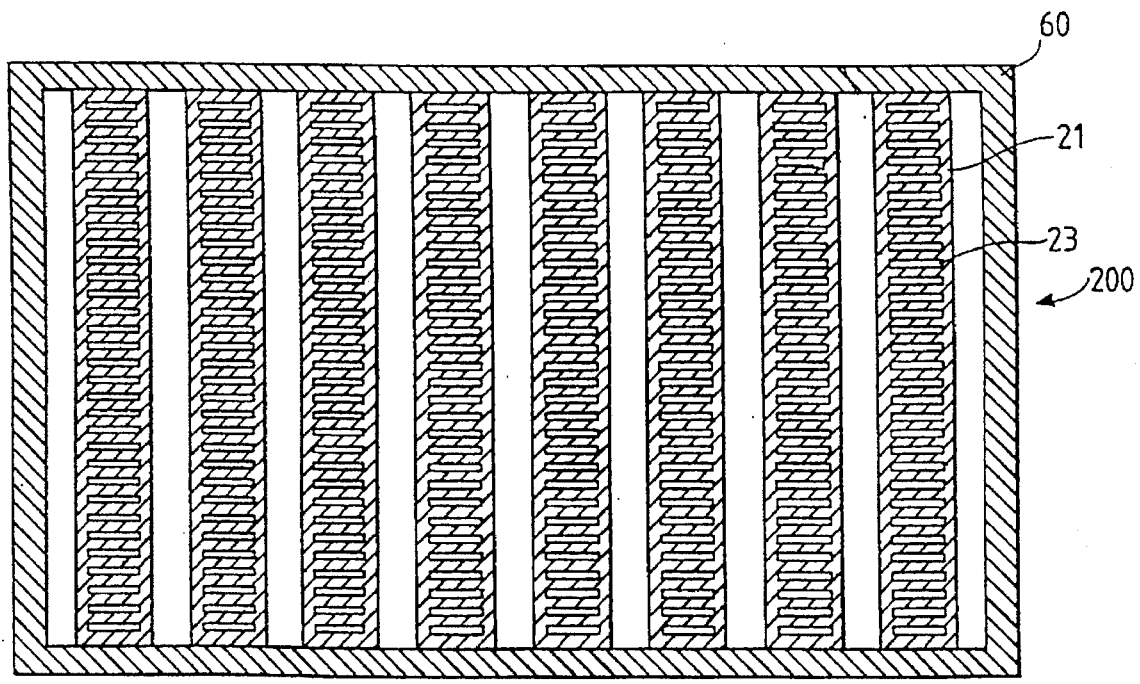
FIG. 7 is a diagrammatic plan view showing a unit block of an IGBT in the device of FIG. 4.

FIG. 7 shows the gate electrode 21 of one unit block 200 of FIG. 4. A plurality of basic cells 150 shown in FIG. 1 are formed in the unit block 200. In this figure, the gate electrode 21 and the pressing oxide films 23 extending between portions of the gate electrode are shown for a clear understanding of the positional relationship. In addition, as described above, a gate interconnect electrode 60 is disposed around the unit block 200, and is connected to each gate electrode 21.

In this embodiment, since the strain damping plate having a linear expansion coefficient substantially equal to that of silicon is press-contacted on the emitter electrode 31 formed on the pressing oxide films 23 of the unit block 200, the gate electrode 21 and the gate oxide film 20 are prevented from being deformed or broken even by the temperature cycle upon large current operation. Thus, there can be obtained an insulated gate type semiconductor device having a high reliability and a large capacity. The large capacity IGBTs in this embodiment can be connected in series to each other by stacking them; accordingly, it is possible to make small the size of a high voltage power inverter using these IGBTs.

Various modifications of the unit cell of FIGS. 1 to 3 will now be described, with the corresponding parts not being described again.

Figure 13:
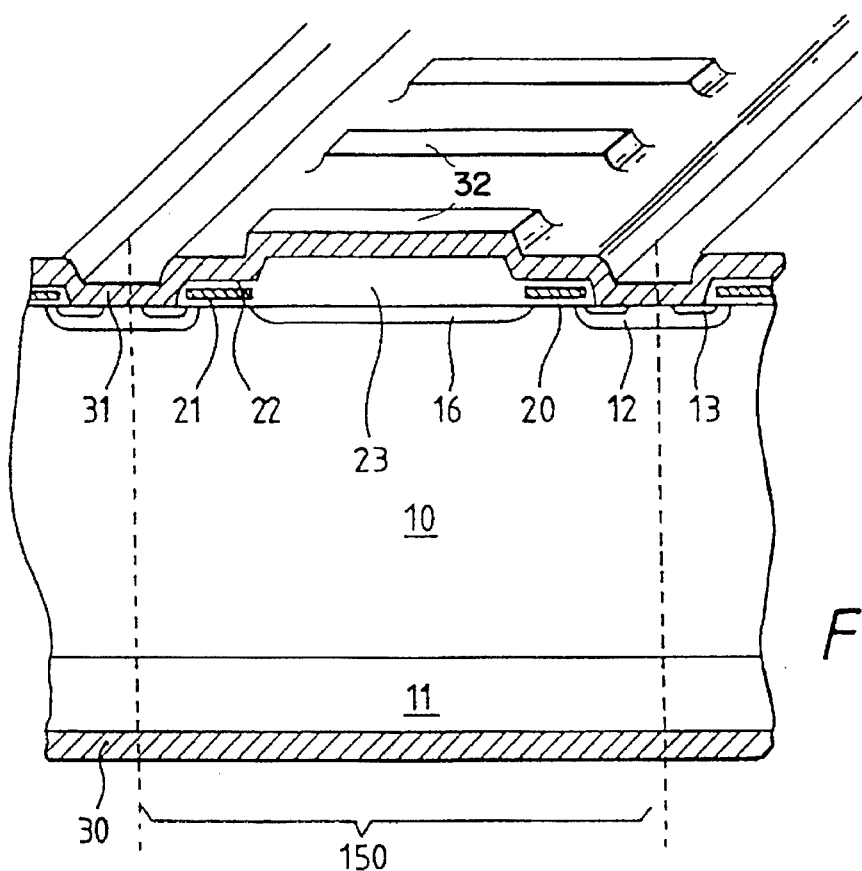
FIG. 13 is a partial sectional view of the structure of a third embodiment of the present invention.

FIG. 13 shows a third embodiment of the present invention which is a modification of the first embodiment. There is shown the sectional structure of a basic cell 150. In this embodiment, unlike first embodiment shown in FIG. 1, a p-type semiconducting layer 16 is formed in the n-type base layer 10 at the position adjacent to each of the pressing oxide films 23. This p-type semiconducting layer 16 is not formed at the positions between adjacent pressing oxide films 23.

In this embodiment, the p-type semiconducting layer 16 acts as a guard ring, so that the depletion layer extending from the junction between the p-type base layer 12 and the n-type base layer 10 in the voltage preventive state extends along the p-type semiconducting layer 16, to relax the intensity of the electric field, thus improving the withstand voltage.

Figure 14:
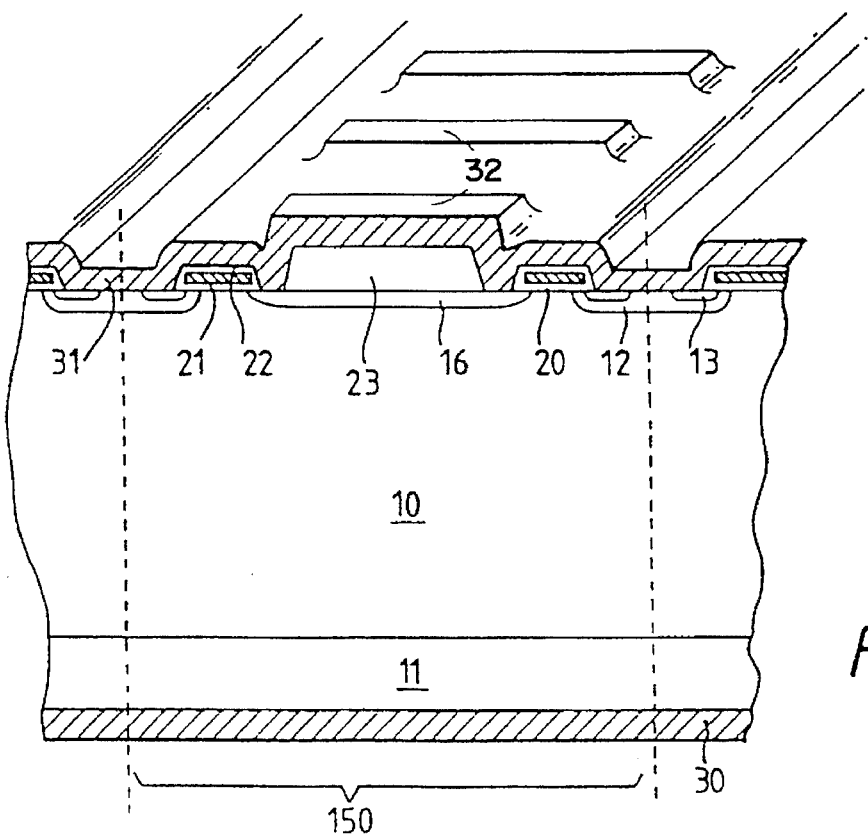
FIG. 14 is a partial sectional view of a fourth embodiment of the present invention.

FIG. 14 shows a fourth embodiment, which is a modification of the third embodiment of FIG. 13. In this embodiment, between the pressing oxide film 23 and the gate electrode 21 the emitter electrode 31 makes ohmic contact with the p-type semiconducting layer 16.

In this embodiment, upon turn-off, positive holes remaining in the n-type base layer 10 are discharged to the emitter electrode 31 through the p-type semiconducting layer 16, so that the turn-off is accelerated, and loss in the turn-off due to the remaining positive holes can be reduced.

Figure 15:
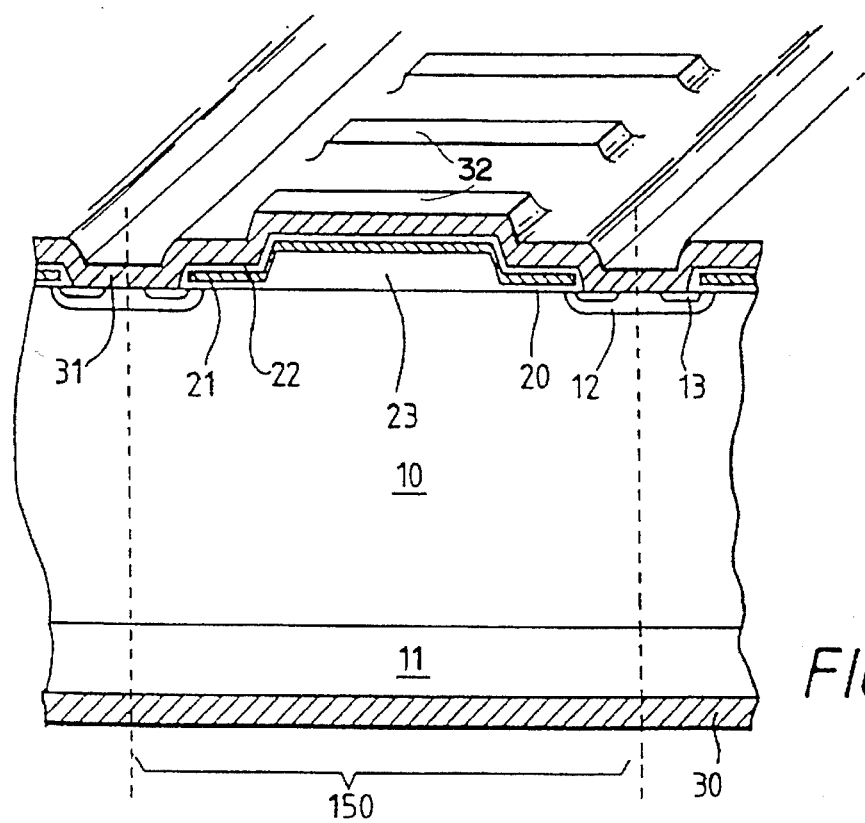
FIG. 15 is a partial sectional view of the structure of a fifth embodiment of the present invention.

FIG. 15 shows a fifth embodiment which is a modification of the first embodiment. In this embodiment, the gate electrode 21 extends over the pressing oxide film 23 under the contact portions 32 of the electrode 31. Such a structure is made possible by the fact that there is insulating material under the contact portion 32 between the emitter electrode 31 and the external electrode plate 100. The thickness of the pressing oxide film 23 from the gate electrode to the exposed surface of the n-type base layer 10 is larger than that of the gate insulating film 20 so that the mechanical strength of the region is increased more than that of the gate insulating film 20, thus preventing the gate insulating film 20 from being affected by the influence of a pressure applied to the pressing oxide film 23.

In this embodiment, the resistance of the gate electrode 21 can be reduced, so that the delay time of a control signal given to each portion of the device can be lowered, thus making it possible to equalize the operation of each portion of the device.

Figure 16:
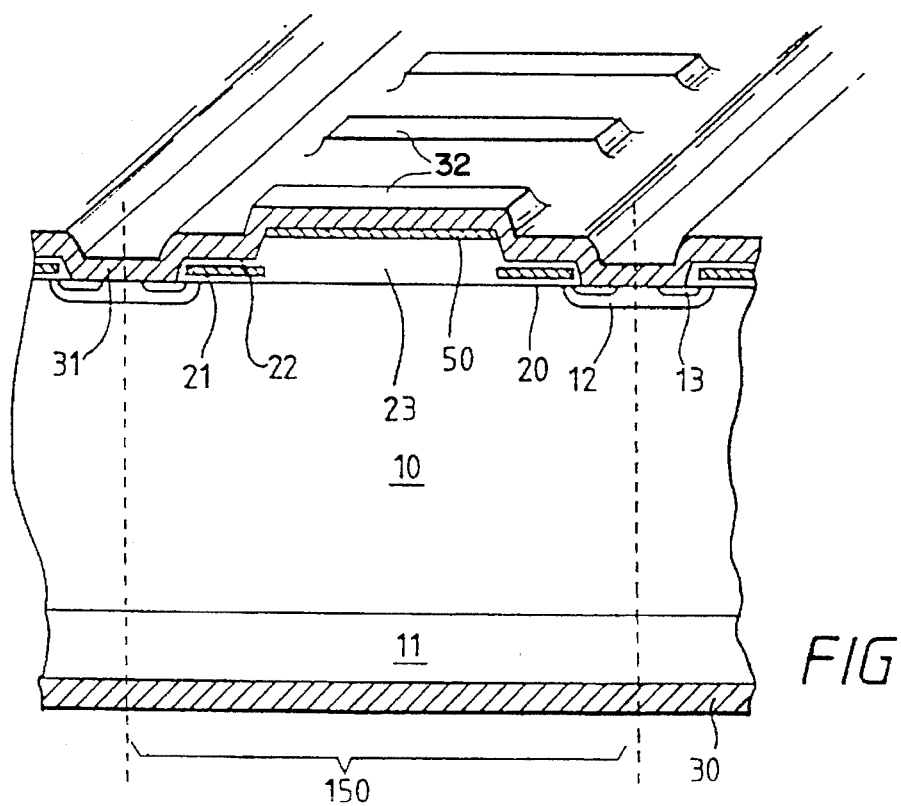
FIG. 16 is a partial sectional view of the structure of a sixth embodiment of the present invention.

FIG. 16 shows a sixth embodiment which again is a modification of the first embodiment. In this embodiment, a polycrystalline layer 50 is provided between the pressing oxide film 23 and the emitter electrode 31, for the following reason. In the formation of an aluminum electrode on a silicon oxide film, particles of aluminum silicide having a relatively large particle size tend to be easily precipitated at the interface thereof. These particles of aluminum silicide, upon pressing of the emitter electrode 31, tend to break the pressing oxide film 23, thus deteriorating the characteristics thereof.

In this embodiment, since the polycrystalline silicon layer 50 is provided between the pressing oxide film 23 and the emitter electrode 31, the precipitation of the particles of aluminum silicide can be prevented. In this embodiment, the polycrystalline silicon layer 50 is formed only on the pressing oxide film 23; however, it may be formed also between the protective oxide film 22 and the emitter electrode 31.

Figure 17:
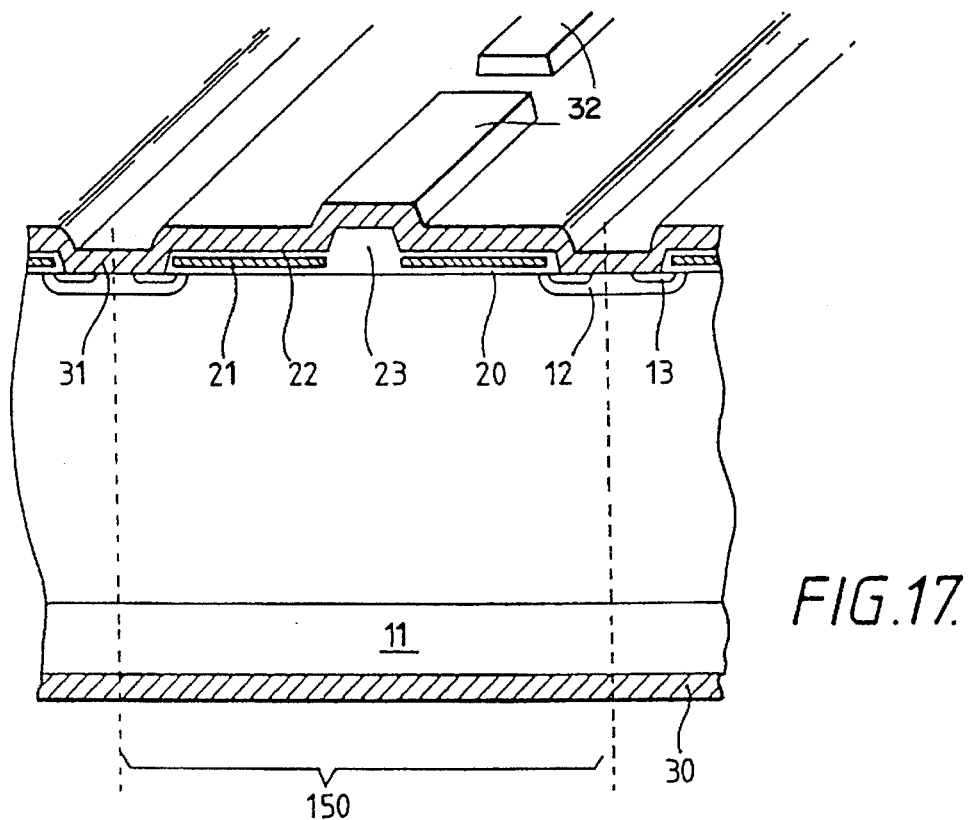
FIG. 17 is a partial sectional view of the structure of a seventh embodiment of the present invention.

FIG. 17 shows a seventh embodiment which is a modification of the first embodiment. In this embodiment, the pressing oxide film 23 which is approximately rectangular plan view is disposed such that the longitudinal direction of the stripe shaped n-type emitter layers 13 is parallel to the longitudinal direction of the pressing oxide film 23. Moreover, the pressing oxide film 23 is formed at the position separated from the n-type emitter layer 13, that is, at the central portion between the n-type emitter layers 13 with specified intervals. Like the first embodiment, the gate oxide film 20, gate electrode 21, and protective oxide film 22 extend between the adjacent pressing oxide films.

According to this embodiment, since the pressing oxide film 23 can be formed at the central portion between the n-type emitter layers 13 where the change in on-voltage due to the presence or absence of the accumulation layer is little observed, the on-voltage is reduced.

Figure 18:
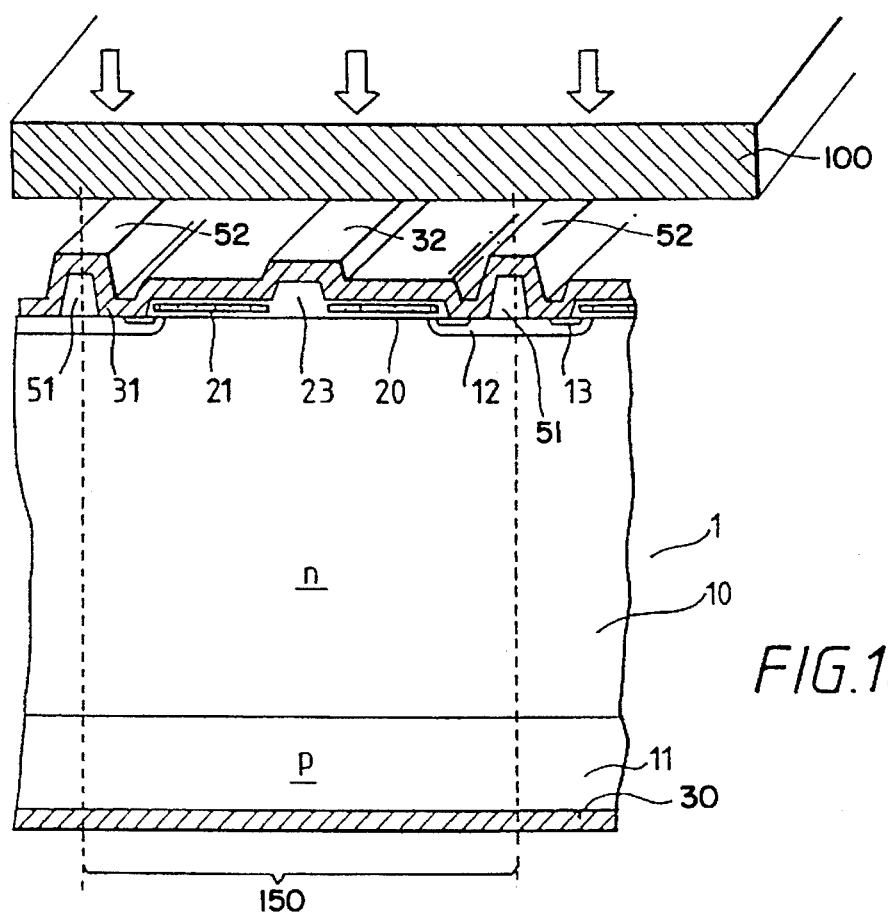
FIG. 18 is a partial sectional view of the structure of a eighth embodiment of the present invention.

FIG. 18 shows an eighth embodiment which is a modification of the seventh embodiment. In this embodiment, a pressing oxide film 51 is formed also on the surface of the p-type base layer 12, in addition to the pressing oxide film 23 shown in the seventh embodiment, to provide additional upper contact regions 52 of the electrode 31. The external electrode plate 100 is simultaneously contacted with the contact regions 32 and 52 above the pressing oxide films 23 and 51. The thickness of the pressing oxide film 51 is set to be substantially equal to that of the pressing oxide film 23.

According to this embodiment, since the contact area between the emitter electrode 31 and the external electrode plate 100 is increased, the reduction in voltage due to the emitter electrode 31 is lowered, thus reducing the on-voltage. Moreover, since the heat generated near the n-type emitter layer 13 can be directly released to the external electrode plate 100, the thermal resistance of the semiconductor device is reduced.

Figure 19:
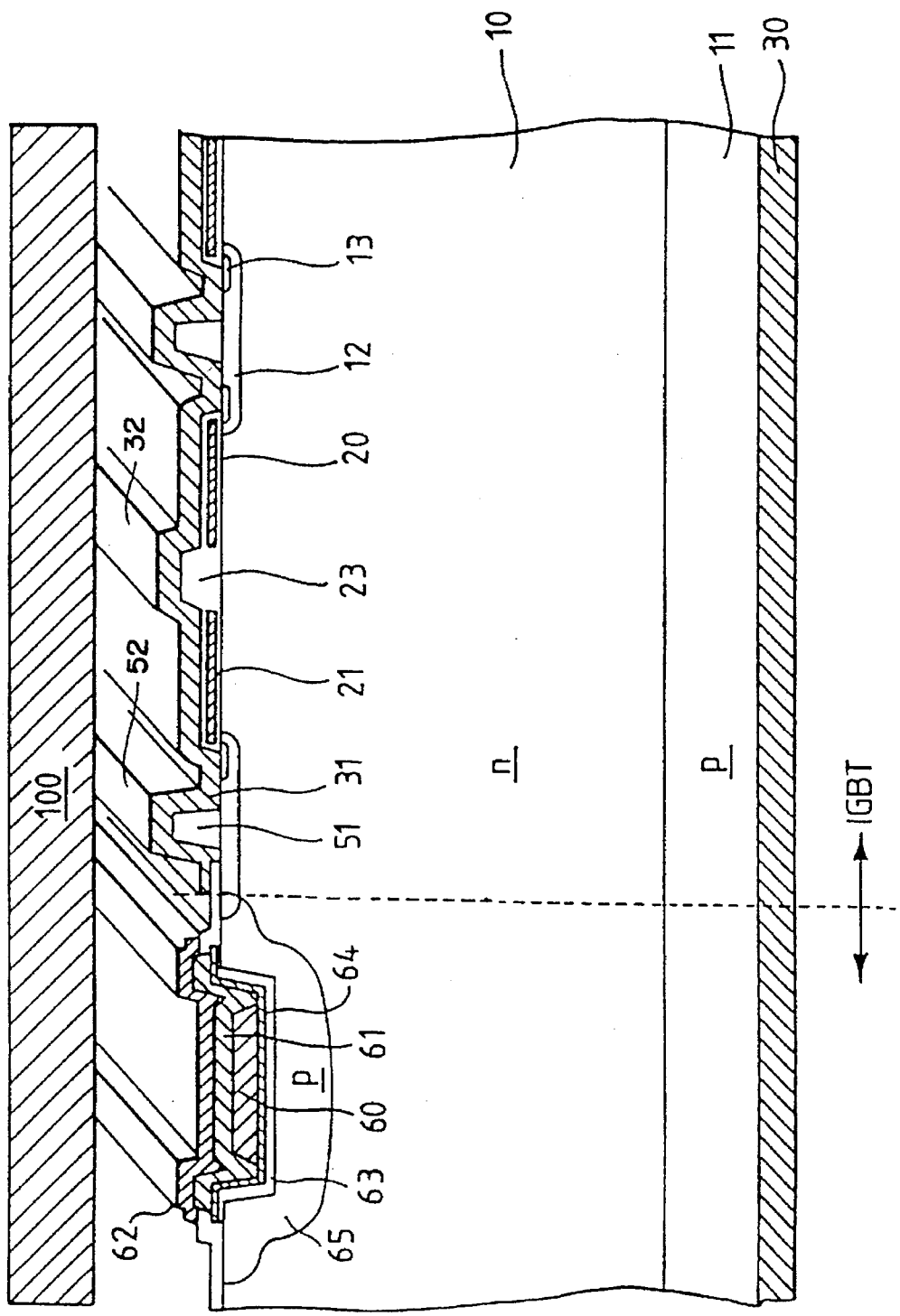
FIG. 19 is a partial sectional view of the structure, including a gate interconnect region, of a ninth embodiment of the present invention.

FIG. 19 shows a ninth embodiment, incorporating the IGBT structure of FIG. 18. It shows a sectional structure of part of the gate interconnect region and IGBT region in the unit block shown in FIG. 7.

In this embodiment, a groove is formed on the main surface of the n-type silicon substrate 1 by wet etching, and a silicon oxide film 63 is formed to cover the surface of the groove portion. On the silicon oxide film 63 is a polycrystalline silicon layer 64 to which the gate electrode 21 is connected in a manner not shown. An aluminum gate interconnect electrode 60 (see FIG. 7) having a width narrower than that of the bottom portion of the groove is provided within the groove. Moreover, on the aluminum gate interconnect electrode 60, an aluminum gate interconnect electrode 61 having a width wider than that of the upper portion of the groove is provided to cover the groove. To prevent the external electrode plate 100 and the aluminum interconnect electrode 61 from being short-circuited by conductive dust, the exposed surface of the interconnect electrode 61 is covered with an insulating film 62 of polyimide resin or the like. Additionally, a highly doped p-type semiconducting layer 65 is provided in the n-type base layer 10 adjacent to the groove for to avoid electric field concentration at the groove in the voltage preventive state, to reduce withstand voltage.

In this embodiment, the depth of the groove is 10 μm, and the thicknesses of the silicon oxide film 63, the polycrystalline layer 64, aluminum gate interconnect electrodes 60 and 61 are 0.5, 3, 5 and 2 μm, respectively. On the other hand, since the thicknesses of the pressing oxide films 23 and 51 are 3 μm as in the first embodiment, contact between the external electrode plate 100 and the aluminum gate interconnect electrodes is avoided. The depth of the junction portion between the highly doped semiconducting layer 65 and the n-type base layer 10 is 15 μm. However, the above dimensions may be suitably changed.

In the case where a polycrystalline silicon layer is formed at an area having a stepped portion as shown in FIG. 19, the polycrystalline silicon is usually made thinner at the stepped portion than that at the flat portion, and thereby it tends to be broken at the stepped portion. In contrast, in this embodiment, since the gate interconnect electrode 61 is provided on the polycrystalline silicon layer 64 so as to cover the groove, and the gate electrode 21 extending from the IGBT region is contacted with the gate interconnect electrode 61, the gate resistance is prevented from being increased even when the film thickness of the polycrystalline silicon layer is made thin at the stepped portion and broken at the stepped portion. This prevents the deterioration of the characteristics and improves reliability. Moreover, since the gate resistance can be reduced by the presence of the gate interconnect electrode 60 provided on the bottom portion of the groove portion, the thickness of the gate interconnect electrode 61 can be made thinner than that of the gate interconnect electrode 60. Accordingly, between the external electrode plate 100 and the gate interconnect electrode 61, there can be provided a gap sufficient to prevent contact between them.

The structure of the above-described gate interconnect portion can be applied to the case where the pressing oxide film is not formed. Even in this case, since the thickness of the gate interconnect electrode 61 can be made thin, the thickness of the gate interconnect electrode can be made thinner than that of the emitter electrode, thus making it possible to prevent the contact between the external electrode plate and the gate interconnect electrode 61.

Figure 20:
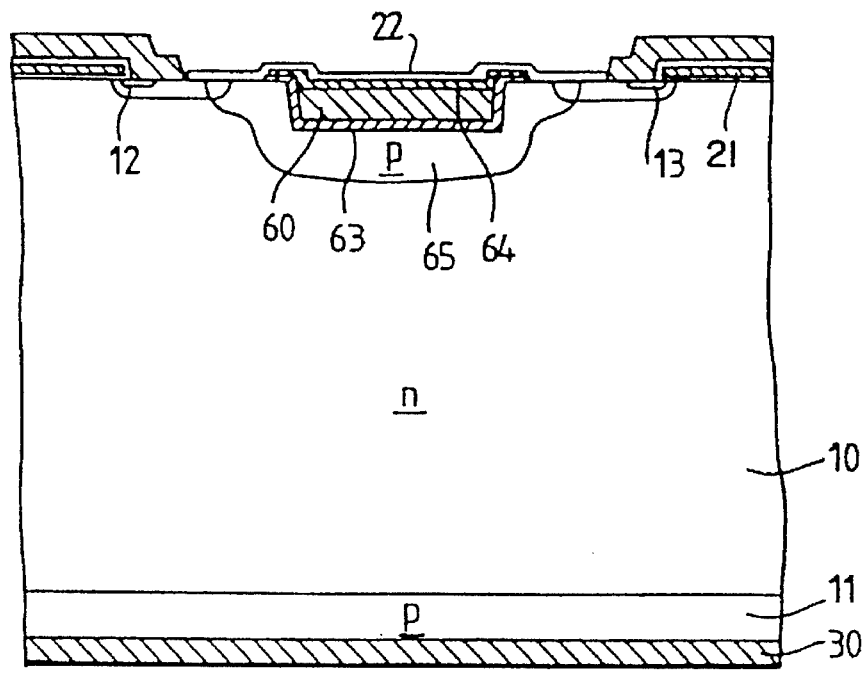
FIG. 20 is a partial sectional view of the structure, including a gate interconnect region, of a tenth embodiment of the present invention.

FIG. 20 shows a tenth embodiment which is a modification of the ninth embodiment. It shows the sectional structure of part of the gate interconnect region. This embodiment is different from the ninth embodiment mainly in that the gate interconnect electrode 60 is made of a metal silicide being a compound of silicon and a metal, and a polycrystalline silicon layer 64 connected to the gate electrode 21 of the IGBT region is formed on the surface of the gate interconnect electrode 60. A high melting point metal such as molybdenum or tungsten is used as the metal forming the above metal silicide.

According to this embodiment, the polycrystalline silicon layer 64, which is not formed at the stepped portion, is prevented from being made thin or broken at the stepped portion. The gate interconnect electrode 60 is made of a metal silicide of a high melting point metal, so that the polycrystalline silicon layer 64 can be formed at the same time as the formation of the gate electrode 21 of the IGBT region after formation of the gate interconnect electrode 60, and the polycrystalline silicon layer 64 and the gate interconnect electrode 61 can be covered with a protective insulating film 22 formed on the surface of the gate electrode. This simplifies the manufacturing process, for example, eliminating the necessity of formation of the insulating film 62 as in the ninth embodiment. On the other hand, since the metal silicide is easily processed to a fine structure as compared with the aluminum electrode, the width of the gate interconnect can be made narrower, thus reducing the size of the semiconductor device.

Figure 21:
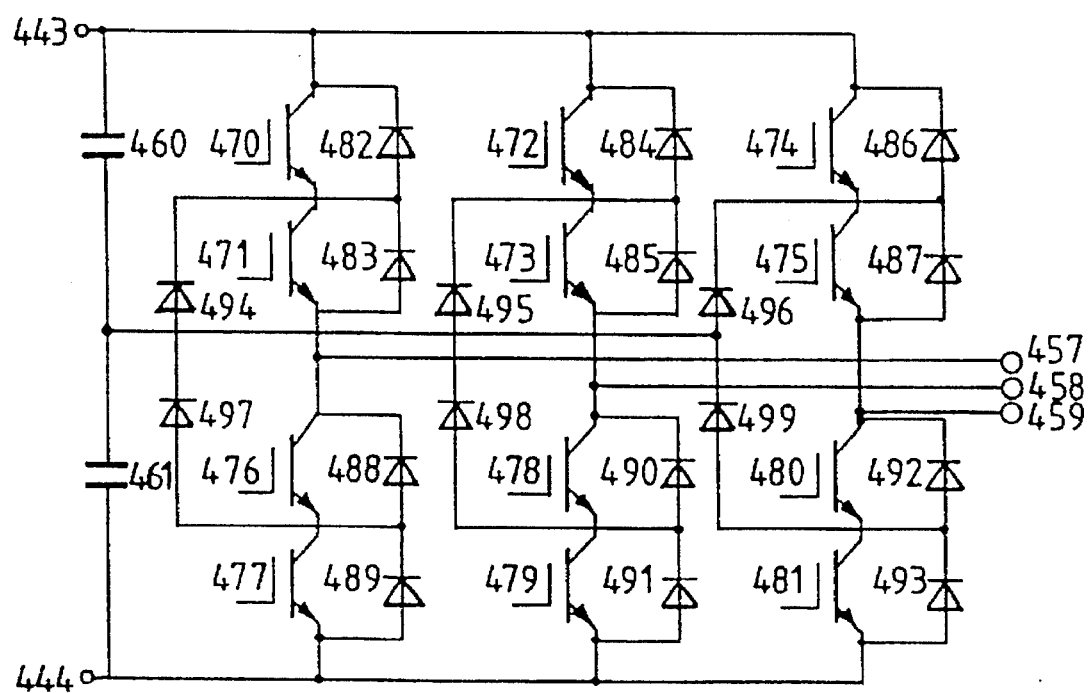
FIG. 21 is a circuit diagram of a power inverter using the IGBT to which the present invention is applied.

FIG. 21 shows a main circuit of a series multi-inverter using IGBTs of the present invention. This inverter is the so-called three-phase inverter of a neutral point clamp type. This inverter includes a pair of DC terminals 443 and 444, and AC terminals 457, 458, 459 corresponding to the three phases. A DC current source is connected to each DC terminal and the IGBTs 470 to 481 are switched, so that the DC power is inverted into AC power to be output to the AC terminals. Filter capacitors 460 and 461, which are connected in series to each other, are connected between the DC terminals. Sets of the IGBTs, 470 and 471, 472 and 473, 474 and 475, 476 and 477, 478 and 479, and 480 and 481 are respectively connected in series to each other. Clamp diodes 494 to 499 are connected between the above respective connection points and the connection point between the filter capacitors 460 and 461. Two sets of the IGBTs, for example, the set of the IGBTs 470 and 471 connected in series to each other are further connected in series to the set of the IGBTs 476 and 477, and the respective connection points are connected to the AC terminals. Free wheel diodes 482 to 493 are connected to the IGBTs 470 to 481, respectively. As the above IGBT, there is used the press-contact type IGBT shown in the second embodiment of FIGS. 4 to 7.

By use of the IGBT of the present invention having stable characteristics and high reliability, there can be obtained an IGBT inverter having a high reliability and a long service life without failure. Since the IGBTs are of press-contact type, they can be stacked so as to be connected in series to connected to each other. Moreover, since the IGBT is driven by the insulated gate, the drive power is small and the gate circuit is also made small, so that the inverter can be reduced in size. There is not required the interconnection in the package, nor external interconnection for connecting a plurality of IGBTs in series to each other, so that even when being connected in series to each other, the IGBTs are prevented from being increased in inductance. Accordingly, even when being connected in series to each other, there is not increased a voltage or noise generated upon high speed operation.

Although the present invention has been described by way of the IGBT, it is not limited thereto, and may be applied to a semiconductor device having an insulated gate such as a MOSFET or MOS control thyristor, or an insulated gate type semiconductor devices of rating current and voltage of various types. In a MOSFET the second main electrode may contact an $n^+$-layer, rather than a p-layer as illustrated by layer 11 of FIG. 1. Moreover, the conducting type of each semiconducting layer in all the devices herein discussed may be changed between p-type and n-type. The pressing oxide film, protective oxide film and gate oxide film may be made of other insulating materials such as polycrystalline silicon with less impurities. The above material may be made of a plurality of insulating materials.

As described above, the present invention is effective in a press-contact type insulated gate type semiconductor device; however, it may be applied to a conventional IGBT module and to a single IGBT. In this case, the interconnect may be fixed to the emitter electrode provided on the pressing oxide film by wire bonding or soldering. With this arrangement, even when the thermal cycle is applied and the thermal strain is generated at the wire bonding or soldering portion, the gate electrode and the gate oxide film can be prevented from being deformed or broken, resulting in improved reliability.

The insulated gate type semiconductor device to which the present invention is applied may be used for a power inverter and power control unit such as an inverter different from the above-described three level inverter, a chopper, a stationary type ineffective power compensating apparatus, AC-DC or DC-AC converter in supply of DC. In particular, the present invention is effective in the field of high voltage using a plurality of semiconductor devices connected in series to each other.

To summarise, as described above, according to the present invention, there can be realized a press-contact type insulated gate type semiconductor device with a high reliability. Moreover, it becomes possible to achieve the insulated gate type semiconductor device increased in size, and enhanced in withstand voltage and current.

The power inverter or power control unit using the insulated gate type semiconductor device of the present invention improves the miniaturization and reliability thereof.

While the invention has been illustrated by several embodiments, it is not limited to them and variations and modifications are possible within the scope of the inventive concept.

What is claimed is:

1. An insulated gate type semiconductor device comprising:
    a semiconductor substrate having a first main surface and a second main surface;
    a first semiconductor region of a first conductivity type, provided in said substrate and exposed at said first main surface;
    a plurality of second semiconductor regions of a second conductivity type, opposite to said first conductivity type, provided in said first semiconductor region and exposed at said first main surface and including a channel portion;
    a plurality of third semiconductor regions of said first conductivity type, provided in each one of said second semiconductor regions and exposed at said first main surface;
    a gate electrode having an active portion located above said first main surface and sufficiently close thereto to control flow of current between said first and third semiconductor regions via said channel portion;
    a first gate insulating layer on said first main surface and lying between said active portion of said gate electrode and said channel portion;
    a second gate insulating layer lying above said active portion of said gate electrode;
    a first main electrode on said first main surface of said substrate contacting said third semiconductor regions and having at least one raised contact portion providing an external contact surface for contact with an external electrode;
    a supporting insulating layer on said first main surface lying between said raised contact portion of said first main electrode and said first main surface and having a thickness greater than the thickness of said first gate insulating layer, said supporting insulating layer being provided directly on a part of said first main surface between said second semiconductor regions; and
    a second main electrode on said second main surface.

2. An insulated gate type semiconductor device according to claim 1, wherein said supporting insulating layer has a thickness greater than the total thickness of said active portion of said gate electrode and said first and second gate insulating layers.

3. An insulated gate type semiconductor device according to claim 1, further comprising a fourth semiconductor region of said second conductivity type, provided in said substrate and exposed at said second main surface and contacted by said second main electrode.

4. An insulated gate type semiconductor device according to claim 3, further comprising a fifth semiconductor region of said second conductivity type provided in said first semiconductor region adjacent said supporting insulating layer.

5. An insulated gate type semiconductor device according to claim 4, wherein said first main electrode contacts said fifth semiconductor region.

6. An insulated gate type semiconductor device according to claim 1, wherein said first main electrode has a plurality of said raised contact portions each of which is surrounded, as seen in a plan view looking onto said first main surface, by said gate electrode, there being a plurality of said supporting insulating layers respectively underlying said raised contact portions.

7. An insulated gate type semiconductor device according to claim 1, wherein said gate electrode extends above said supporting insulating layer.

8. An insulated gate type semiconductor device according to claim 1, wherein a layer of polycrystalline silicon lies between said raised contact portion of said first electrode, which is made of aluminium, and said supporting insulating layer, which is made of silicon oxide.

9. An insulated gate type semiconductor device according to claim 1, wherein said first main electrode provides a further raised contact region, for contact with said external electrode, laterally adjacent a contact region of said first main electrode with said second semiconductor region, there being a further supporting insulating layer on said first main surface lying between said second semiconductor region and said further raised contact region.

10. An insulated gate type semiconductor device according to claim 1, wherein said device has a pair of said second semiconductor regions extending parallel to each other along said first main surface, a pair of said third semiconductor regions extending parallel to each other, a pair of said active portions of said gate electrode extending parallel to each other with the channel portion of said second semiconductor regions at the mutually proximal sides thereof, said supporting insulating layer lying laterally between said pair of active portions and said first main electrode extending over said pair of active portions and said supporting insulating layer.

11. An insulated gate type semiconductor device according to claim 1 which has a plurality of unit blocks each comprising a plurality of said second and third semiconductor regions, a plurality of said active portion of said gate electrode, a plurality of said first and second gate insulating layers, a plurality of said raised contact portions of said first main electrode and a plurality of said supporting insulating layers, said device further having interconnect electrodes on said first main surface connecting the respective said gate electrodes of said unit blocks to each other.

12. An insulated gate type semiconductor device according to claim 1, further comprising a fourth semiconductor region of said second conductivity type provided in said first semiconductor region adjacent said supporting insulating layer.

13. An insulated gate type semiconductor device according to claim 12, wherein said first main electrode contacts said fourth semiconductor region.

14. An insulated gate type semiconductor device comprising:
    a semiconductor substrate having a first main surface and a second main surface;
    a first semiconductor region of a first conductivity type, provided in said substrate and exposed at said first main surface;

a plurality of second semiconductor regions of a second conductivity type, opposite to said first conductivity type, provided in said first semiconductor region and exposed at said first main surface and including a channel portion;

a plurality of third semiconductor regions of said first conductivity type, provided in each one of said second semiconductor regions and exposed at said first main surface;

a gate electrode having an active portion located above said first main surface and sufficiently close thereto to control flow of current between said first and third semiconductor regions via said channel portion;

a first gate insulating layer on said first main surface and lying between said active portion of said gate electrode and said channel portion;

a first main electrode on said first main surface of said substrate contacting said third semiconductor regions and having at least one raised contact portion providing an external contact surface for contact with an external electrode;

a supporting insulating layer on said first main surface lying between said raised contact portion of said first main electrode and said first main surface of said substrate and having a thickness greater than 1 μm, said supporting insulating layer being provided directly on a part of said first main surface between said second semiconductor regions; and a second main electrode on said second main surface, wherein a surface of said first main electrode above said active portion of said gate electrode is closer to said first main surface than said external contact surface of said first main electrode.

15. An insulated gate type semiconductor device according to claim 14, wherein said first main surface of said semiconductor substrate is substantially planar, at least at its region underlying said first main electrode.

16. An insulated gate type semiconductor device comprising:

a semiconductor substrate having a first main surface and a second main surface;

a first semiconductor region of a first conductivity type, provided in said substrate and exposed at said first main surface;

a plurality of second semiconductor regions of a second conductivity type, opposite to said first conductivity type, provided in said first semiconductor region and exposed at said first main surface and including a channel portion;

a plurality of third semiconductor regions of said first conductivity type, provided in each one of said second semiconductor regions and exposed at said first main surface;

a gate electrode having an active portion located above said first main surface and sufficiently close thereto to control flow of current between said first and third semiconductor regions via said channel portion;

a first gate insulating layer on said first main surface and lying between said active portion of said gate electrode and said channel portion;

a first main electrode on said first main surface of said substrate contacting said third semiconductor regions to provide an interface therewith and having at least one raised contact portion providing an external contact surface for contact with an external electrode;

a supporting insulating layer formed on said first main surface to provide an interface therewith and lying between said raised contact portion of said first main electrode and said first main surface of said substrate, said supporting insulating layer being provided directly on a part of said first main surface between said second semiconductor regions; and a second main electrode on said second main surface, wherein a surface of said first main electrode above said active portion of said gate electrode is closer to said first main surface than said external contact surface of said first main electrode, and wherein said interface of said first main electrode with said third semiconductor regions, respectively, is coplanar with said interface of said supporting insulating layer with said first main surface.

17. In an insulated gate type semiconductor device comprising a semiconductor substrate having a first region of a first conductivity type; a plurality of second semiconductor regions of a second, opposite conductivity type, provided in said first region and each of which is exposed at a main surface of said substrate and includes a channel portion; a plurality of third semiconductor regions of said first conductivity type, provided in each of said second semiconductor regions and exposed at said main surface; a gate electrode which controls current flow between said second and said third semiconductor regions via said channel portion; and a main electrode which has a first portion contacting said third semiconductor regions, a second portion extending above said gate electrode and a third portion providing a raised external contact surface, said gate electrode being insulated above and below by insulating films, the improvement comprising a supporting insulating layer on a main surface of said substrate, said supporting insulating layer underlying said third portion of said main electrode, having a thickness substantially greater than the thickness of said insulating film below said gate electrode and being provided directly on a part of said main surface between said second semiconductor regions, whereby said raised external contact surface is more remote from said main surface of said substrate than said second portion of said main electrode.

18. An insulated gate type semiconductor device according to claim 17, wherein said supporting insulating layer has a thickness greater than the total thickness of said gate electrode and said insulating films.

19. An insulated gate type semiconductor device according to claim 17, wherein said supporting insulating layer has a thickness of at least 1 μm.

20. An assembly comprising an insulated gate type semiconductor device comprising:

a semiconductor substrate having a first main surface and a second main surface;

a first semiconductor region of a first conductivity type, provided in said substrate and exposed at said first main surface;

a second semiconductor region of a second conductivity type, opposite to said first conductivity type, provided in said first semiconductor region and exposed at said first main surface and including a channel portion;

a third semiconductor region of said first conductivity type, provided in said second semiconductor region and exposed at said first main surface;

a gate electrode having an active portion located above said first main surface and sufficiently close thereto to control flow of current between said first and third semiconductor regions via said channel portion;

a first gate insulating layer on said first main surface and lying between said active portion of said gate electrode and said channel portion;

a second gate insulating layer lying above said active portion of said gate electrode;

a first main electrode on said first main surface of said substrate contacting said third semiconductor region and having at least one raised contact portion providing an external contact surface for contact with an external electrode, said external contact surface not overlapping said active portion of said gate electrode;

a supporting insulating layer on said first main surface lying between said raised contact portion of said first main electrode and said first main surface and having a thickness greater than the thickness of said first gate insulating layer, said supporting insulating layer being provided directly on a surface of said first semiconductor region; and a second main electrode on said second main surface;

said assembly further including an electrode body held in pressing contact with said external contact surface of said first main electrode of said semiconductor device.

21. An assembly comprising an insulated gate type semiconductor device comprising:

a semiconductor substrate having a first main surface and a second main surface;

a first semiconductor region of a first conductivity type, provided in said substrate and exposed at said first main surface;

a second semiconductor region of a second conductivity type, opposite to said first conductivity type, provided in said first semiconductor region and exposed at said first main surface and including a channel portion;

a third semiconductor region of said first conductivity type, provided in said second semiconductor region and exposed at said first main surface;

a gate electrode having an active portion located above said first main surface and sufficiently close thereto to control flow of current between said first and third semiconductor regions via said channel portion;

a first gate insulating layer on said first main surface and lying between said active portion of said gate electrode and said channel portion;

a first main electrode on said first main surface of said substrate contacting said third semiconductor region and having at least one raised contact portion providing an external contact surface for contact with an external electrode;

a supporting insulating layer on said first main surface lying between said raised contact portion of said first main electrode and said first main surface of said substrate and having a thickness greater than 1 μm, said supporting insulating layer being provided directly on a surface of said first semiconductor region; and a second main electrode on said second main surface;

wherein a surface of said first main electrode above said active portion of said gate electrode is closer to said first main surface than said external contact surface of said first main electrode;

said assembly further including an electrode body held in pressing contact with said external contact surface of said first main electrode of said semiconductor device.

22. An insulated gate type semiconductor device comprising:

a semiconductor substrate having a first main surface and a second main surface;

a first semiconductor region of a first conductivity type, provided in said substrate and exposed at said first main surface;

a plurality of second semiconductor regions of a second conductivity type, opposite to said first conductivity type, provided in said first semiconductor region and exposed at said first main surface;

a plurality of third semiconductor regions of said first conductivity type, respectively provided in said second semiconductor regions and exposed at said first main surface;

a plurality of gate electrode active portions located respectively above said first main surface adjacent said second semiconductor regions to control flow of current between said first semiconductor region and said third semiconductor regions;

a plurality of first gate insulating layers respectively lying between said gate electrode active portions and said second semiconductor regions;

a first main electrode structure connecting said plurality of third semiconductor regions to each other and adapted to contact an external electrode;

a second main electrode on said second main surface of said substrate;

a groove formed in said first main surface of said substrate;

a groove insulating layer covering at least part of the surface of said groove;

a conductive polycrystalline silicon layer lying above said groove insulating layer and connected to said plurality of gate electrode active portions; and a conductive metal layer in said groove contacting said polycrystalline silicon layer.

23. An insulated gate type semiconductor device according to claim 22, wherein said polycrystalline layer extends in said groove under said metal layer.

24. An insulated gate type semiconductor device according to claim 22, wherein said polycrystalline layer extends over said metal layer.

25. A power inverter comprised of a plurality of circuits each of which is formed by serially connecting at least a pair of switching devices between DC terminals, wherein said plurality of circuits which are an integer times as large as the number of phases on an AC side of the power inverter are connected in parallel, wherein AC terminals are led out from midpoint connections of the switching devices which are serially connected to form individual ones of said circuits, and wherein each of said switching devices comprises:

a semiconductor substrate having a first main surface and a second main surface;

a first semiconductor region of a first conductivity type, provided in said substrate and exposed at said first main surface;

a second semiconductor region of a second conductivity type, opposite to said first conductivity type, provided in said first semiconductor region and exposed at said first main surface and including a channel portion;

a third semiconductor region of said first conductivity type, provided in said second semiconductor region and exposed at said first main surface;

a gate electrode having an active portion located above said first main surface and sufficiently close thereto to control flow of current between said first and third semiconductor regions via said channel portion;

a first gate insulating layer on said first main surface and lying between said active portion of said gate electrode and said channel portion;

a second gate insulating layer lying above said active portion of said gate electrode;

a first main electrode on said first main surface of said substrate contacting said third semiconductor region and having at least one raised contact portion providing an external contact surface for contact with an external electrode, said external contact surface not overlapping said active portion of said gate electrode;

a supporting insulating layer on said first main surface lying between said raised contact portion of said first main electrode and said first main surface and having a thickness greater than the thickness of said first gate insulating layer, said supporting insulating layer being provided directly on a surface of said first semiconductor region; and a second main electrode on said second main surface.

26. A power inverter comprised of a plurality of circuits each of which is formed by serially connecting at least a pair of switching devices between DC terminals, wherein said plurality of circuits which are an integer times as large as the number of phases on an AC side of the power inverter are connected in parallel, wherein AC terminals are led out from midpoint connections of the switching devices which are serially connected to form individual ones of said circuits, and wherein each of said switching devices comprises:

a semiconductor substrate having a first main surface and a second main surface;

a first semiconductor region of a first conductivity type, provided in said substrate and exposed at said first main surface;

a second semiconductor region of a second conductivity type, opposite to said first conductivity type, provided in said first semiconductor region and exposed at said first main surface and including a channel portion;

a third semiconductor region of said first conductivity type, provided in said second semiconductor region and exposed at said first main surface;

a gate electrode having an active portion located above said first main surface and sufficiently close thereto to control flow of current between said first and third semiconductor regions via said channel portion;

a first gate insulating layer on said first main surface and lying between said active portion of said gate electrode and said channel portion;

a first main electrode on said first main surface of said substrate contacting said third semiconductor region and having at least one raised contact portion providing an external contact surface for contact with an external electrode;

a supporting insulating layer on said first main surface lying between said raised contact portion of said first main electrode and said first main surface of said substrate and having a thickness greater than 1 μm, said supporting insulating layer being provided directly on a surface of said first semiconductor region; and a second main electrode on said second main surface, wherein a surface of said first main electrode above said active portion of said gate electrode is closer to said first main surface than said external contact surface of said first main electrode.

27. A power inverter comprised of a plurality of circuits each of which is formed by serially connecting at least a pair of switching devices between DC terminals, wherein said plurality of circuits which are an integer times as large as the number of phases on an AC side of the power inverter are connected in parallel, wherein AC terminals are led out from midpoint connections of the switching devices which are serially connected to form said circuits, and wherein each of said switching devices comprises:

a semiconductor substrate having a first main surface and a second main surface;

a first semiconductor region of a first conductivity type, provided in said substrate and exposed at said first main surface;

a second semiconductor region of a second conductivity type, opposite to said first conductivity type, provided in said first semiconductor region and exposed at said first main surface and including a channel portion;

a third semiconductor region of said first conductivity type, provided in said second semiconductor region and exposed at said first main surface;

a gate electrode having an active portion located above said first main surface and sufficiently close thereto to control flow of current between said first and third semiconductor regions via said channel portion;

a first gate insulating layer on said first main surface and lying between said active portion of said gate electrode and said channel portion;

a first main electrode on said first main surface of said substrate contacting said third semiconductor region to provide an interface therewith and having at least one raised contact portion providing an external contact surface for contact with an external electrode;

a supporting insulating layer on said first main surface lying between said raised contact portion of said first main electrode and said first main surface of said substrate and having a thickness greater than 1 μm, said supporting insulating layer being provided directly on a surface of said first semiconductor region; and a second main electrode on said second main surface, wherein a surface of said first main electrode above said gate electrode is closer to said first main surface than said external contact surface of said first main electrode, and wherein said interface of said first main electrode with said third semiconductor region is coplanar with said interface of said supporting insulating layer with said first main surface.

28. A power inverter comprised of a plurality of circuits each of which is formed by serially connecting at least a pair of switching devices between DC terminals, wherein said plurality of circuits which are an integer times as large as the number of phases on an AC side of the power inverter are connected in parallel, wherein AC terminals are led out from midpoint connections of the switching devices which are serially connected to form individual ones of said circuits, and wherein each of said switching devices comprises:

a semiconductor substrate having a first main surface and a second main surface;

a first semiconductor region of a first conductivity type, provided in said substrate and exposed at said first main surface;

a plurality of second semiconductor regions of a second conductivity type, opposite to said first conductivity type, provided in said first semiconductor region and exposed at said first main surface;

a plurality of third semiconductor regions of said first conductivity type, respectively provided in said second semiconductor regions and exposed at said first main surface;

a plurality of gate electrode active portions located respectively above said first main surface adjacent said second semiconductor regions to control flow of current between said first semiconductor region and said third semiconductor regions;

a plurality of first gate insulating layers respectively lying between said gate electrode active portions and said second semiconductor regions;

a first main electrode structure connecting said plurality of third semiconductor regions to each other and adapted to contact an external electrode;

a second main electrode on said second main surface of said substrate;

a groove formed in said first main surface of said substrate;

a groove insulating layer covering at least part of the surface of said groove;

a conductive polycrystalline silicon layer lying above said groove insulating layer and connected to said plurality of gate electrode active portions; and a conductive metal layer in said groove contacting said polycrystalline silicon layer.

29. A power inverter according to claim 28, wherein in each of said switching devices said polycrystalline layer extends in said groove under said metal layer.

30. A power inverter according to claim 28, wherein in each of said switching devices said polycrystalline layer extends over said metal layer.

* * * * *